United States Patent [19]
Whitten et al.

[11] Patent Number: 5,341,267
[45] Date of Patent: Aug. 23, 1994

[54] STRUCTURES FOR ELECTROSTATIC DISCHARGE PROTECTION OF ELECTRICAL AND OTHER COMPONENTS

[75] Inventors: Ralph G. Whitten, San Jose; Ta-Pen Guo, Cupertino; Amr Mohsen, Saratoga; Alan E. Comer, San Jose, all of Calif.

[73] Assignee: Aptix Corporation, San Jose, Calif.

[21] Appl. No.: 763,964

[22] Filed: Sep. 23, 1991

[51] Int. Cl.⁵ .................. H02H 9/00; H01H 37/76
[52] U.S. Cl. .................... 361/56; 257/530; 307/202.1
[58] Field of Search ............... 324/550, 537; 307/202.1, 465, 465.1; 257/530; 361/111, 56, 110, 104

[56] References Cited

U.S. PATENT DOCUMENTS

| | | | |
|---|---|---|---|
| 4,412,241 | 10/1983 | Nelson | 357/51 |
| 4,823,181 | 4/1989 | Mohsen et al. | 357/51 |
| 5,151,611 | 9/1992 | Rippey | 307/202.1 |

Primary Examiner—Jeffrey A. Gaffin
Assistant Examiner—Ronald W. Leja
Attorney, Agent, or Firm—D'Alessandro, Frazzini & Ritchie

[57] ABSTRACT

A first passive ESD protection device for an electronic component in a microcircuit includes a fuse element shunting the component to be protected and includes a passive programming path from the outside of the microcircuit to the fuse element. A second passive ESD protection device is deactivatable and reactivatable and includes a first fuse element shunted by a second fuse element in series with a first antifuse element. Shunting the second fuse element with a third fuse element in series with a second antifuse element permits a second deactivation and reactivation to be performed. Additional deactivation/reactivation cycles may be permitted by providing additional series combinations of fuse elements and antifuse elements shunting the preceding fuse element. Combinations of the passive protection device and dual elements comprise ESD protection schemes which may be deactivated and activated multiple times.

16 Claims, 12 Drawing Sheets

STRUCTURES FOR ELECTROSTATIC DISCHARGE PROTECTION OF ELECTRICAL AND OTHER COMPONENTS

BACKGROUND OF THE INVENTION

1. Field Of The Invention

The present invention relates to electrostatic discharge (ESD) protection for electronic and other components, including electrically-programmable user-programmable interconnect elements and to microcircuits and other structures containing a plurality of components to be protected. More particularly, the present invention relates to structures for protecting the microcircuits, and particularly user-programmable interconnect elements and other components contained thereon, from electrostatic discharge (ESD).

2. The Prior Art

Protection of electronic devices from damage due to ESD is imperative for most electronic devices. In the case of transistors and integrated circuits, the protection is typically provided by specialized transistors, diodes, capacitors and resistors which are added to the portions of the integrated circuit which are likely to be exposed to ESD. Some types of circuits, however, do not have these types of components available to use as protection devices. Examples of these types of circuits include some types of programmable devices, multichip modules, hybrids, thin film circuits or flat panel displays. These types of devices would greatly benefit from a type of ESD protection device fabricated from thin film devices which would protect these circuits from ESD damage.

Electrically-programmable user-programmable interconnect elements are finding increasing usage in microcircuits of all kinds, ranging from integrated circuits to complex interconnection matrices. One popular type of electrically-programmable user-programmable interconnect element is known as an antifuse. An antifuse is basically two conductive electrodes which are separated by an antifuse material which is initially essentially non-conductive. Applying a programming voltage potential across the two conductive electrodes causes a disruption in the antifuse material resulting in a low-impedance conductive path between the two conductive electrodes.

Because the antifuse programming mechanism is essentially a voltage dependent phenomenon, unprogrammed antifuses are susceptible to ESD damage caused by static charge buildup across the two conductive electrodes. Static charges can create enough of a potential difference across the two conductive electrodes to result in the inadvertent programming of antifuse devices. Antifuse devices must be protected from voltages which meet or exceed the programming voltage; however, the protection must also allow the user to apply the programming voltage when desired and must not otherwise interfere with desired programming.

Several schemes are known in the prior art for protection of antifuse devices from static charge buildup during manufacturing, shipping, testing, and handling of the microcircuits containing the antifuse devices. For example, U.S. Pat. No. 4,941,028 to Chen et al. discloses both an active MOS transistor switch for discharging static voltage buildup and a thin oxide region overlying a diffused region providing a weakened region which will preferentially rupture prior to the voltage reaching a magnitude which will harm the thin dielectric regions associated with antifuse devices which it is designed to protect. U.S. Pat. No. 4,786,956 to Puar discloses an integrated circuit with active circuit components to protect the thin gate dielectrics associated with input circuits in integrated circuits.

While the prior art structures are useful to minimize certain ESD damage caused to structures such as antifuses, there remains room for improvement in such protection structures. For example, there is often a requirement for multiple handling of the microcircuit devices as they are tested and stored during the numerous operations which occur prior to shipment of the devices to customers who will ultimately program them. Each step of this process carries the potential for ESD damage to the antifuse devices. ESD protection devices for antifuses must be disabled to test or otherwise use the microcircuit device, and known prior art protection devices are irreversibly disabled, prohibiting complete protection in an environment in which multiple tests separated by handling and/or storage periods are required.

In addition, there are some antifuse applications which do not permit the use of active transistor protection devices, such as applications where the antifuse elements are disposed on an insulating substrate which does not allow for the fabrication of active devices thereon. In such situations only passive protection devices may be employed.

Finally, certain other electronic components, such as flat panel displays, and certain mechanical components, which contain metal layers and dielectric layers, are also subject to ESD damage. Presently, panel displays are protected by hard-wire short circuiting the conductors of the display array to one another. When the panel is ready for installation, the shorting conductor is mechanically cut away from the structure. It would be advantageous to provide an electrically deactivated ESD protection device.

BRIEF DESCRIPTION OF THE INVENTION

A first passive ESD protection device for a component in a microcircuit or other structure according to the present invention includes a fuse element shunting the component to be protected. A programming path, usually provided from the outside of the microcircuit or other structure provides a programming path to the fuse element.

A passive ESD protection device for a component includes a first fuse element shunted by a first dual element including a second fuse element in series with a first antifuse element. Use of this structure allows the ESD protection device to be deactivated by programming the first fuse element and reactivated by programming the first antifuse element to allow performance of at least one testing procedure followed by reactivation of the ESD protection device. The ESD protection device may be finally deactivated by programming the second fuse element. This applies to circuits which can tolerate or for which there is a need for a deactivated ESD protection device.

Shunting the second fuse element with a second dual element including a third fuse element in series with a second antifuse element permits an additional deactivation-reactivation cycle to allow a second testing procedure to be performed followed by reactivation of the ESD protection device. Additional deactivation-reactivation cycles allowing performance of further intermediate testing procedures may be permitted by providing additional dual elements shunting the fuse element of the preceding dual element.

An ESD protection scheme according to a third aspect of the invention employs a plurality of ESD protection devices according to the present invention to protect a multiconductor electrical circuit such as a user-programmable interconnect matrix which contains a plurality of components, each of which is connected between a first conductor and a second conductor and allows for multiple deactivation-reactivation cycles. An ESD protection device is connected between each first conductor in the multiconductor circuit and a first extra conductor provided for the ESD protection scheme. An ESD protection device is also connected between each second conductor in the multiconductor circuit and a second extra conductor provided for the ESD protection scheme. An ESD protection device is connected between the first and second extra conductors.

BRIEF DESCRIPTION OF THE DRAWINGS

FIG. 1b is a simplified schematic diagram of an exemplary interconnect matrix including a variation of the ESD protection scheme of FIG. 1a.

DETAILED DESCRIPTION OF A PREFERRED EMBODIMENT

Those of ordinary skill in the art will realize that the following description of the present invention is illustrative only and not in any way limiting. The disclosure in the instant specification will focus on the application of the present invention to user-programmable circuits. Other embodiments of the invention will readily suggest themselves to such skilled persons.

As used herein, the term "fuse element" shall refer to a user-programmable element which is essentially a short circuit in a first unprogrammed state and which may be irreversibly converted to an open circuit in a second programmed state by passing a predetermined programming current through it. The term "antifuse element" shall refer to a user-programmable element which is essentially an open circuit in a first unprogrammed state and which may be irreversibly converted to a short circuit in a second programmed state by placing a predetermined programming voltage across it. The term "dual element" shall refer to a fuse element in series with an antifuse element. The term "component" shall refer to any mechanical or electrical structure which is subject to physical damage by ESD and which includes electrical conductors, dielectric layers and/or more complicated structures, both active and passive, which are either a part of a deliberately formed electrical circuit or an electrical circuit which is inherent in a mechanical structure.

Figure 1A:
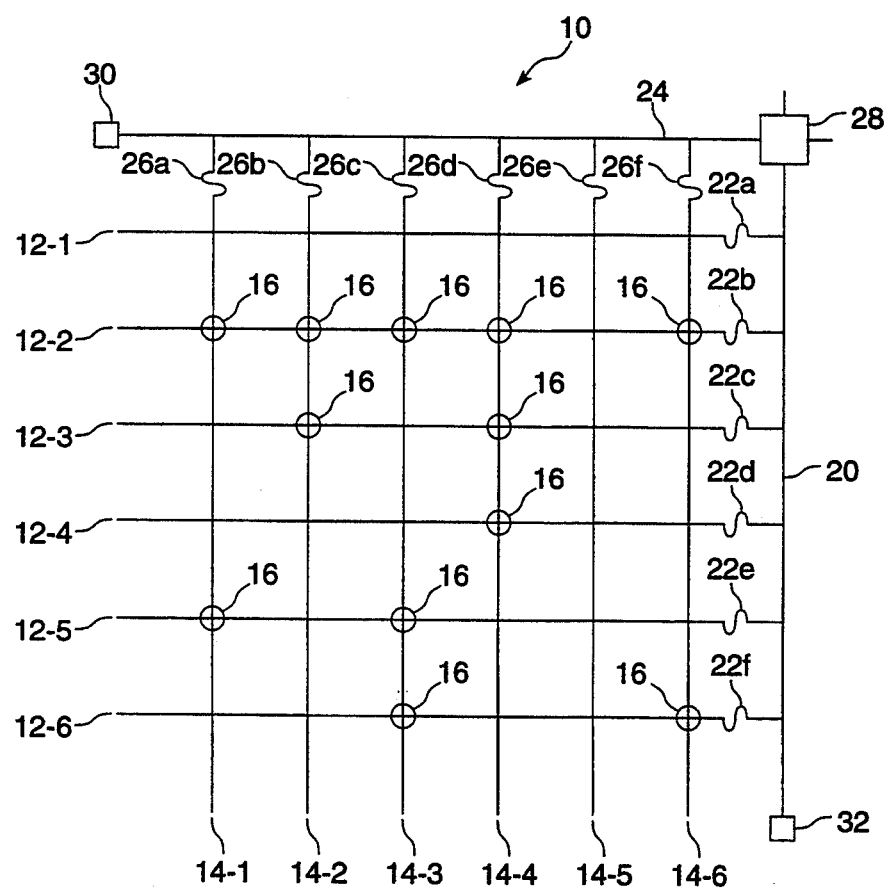
FIG. 1a is a simplified schematic diagram of an exemplary interconnect matrix including a first ESD protection scheme according to the present invention.

Referring first to FIG. 1a, a schematic diagram of a user-programmable interconnect matrix illustrates a first embodiment of the present invention employed in a typical user-programmable circuit environment. Those of ordinary skill in the art will recognize that the interconnect matrix of FIG. 1a is merely an illustrative environment in which the present invention is useful and that, once the principles and construction of the present invention are understood, other circuit applications for the present invention will suggest themselves.

User-programmable interconnect matrix 10 includes a plurality of intersecting horizontal conductors 12-1 through 12-6 and vertical connectors 14-1 through 14-6. These horizontal and vertical conductors form intersections. User-programmable interconnect elements 16 are connected between selected ones of the horizontal and vertical conductors at selected ones of the intersections. These elements can be any type of antifuse device or any device containing antifuses.

As is well understood by those of ordinary skill in the art, a substantial likelihood of electrostatic charge buildup exists during the packaging, storing, shipping, and other operations and handling of user-programmable interconnect matrix 10. Some user-programmable devices, notably antifuses and other device which employ voltage programming mechanisms, are particularly sensitive to damage from static charge buildup, which can easily generate voltages in excess of the designed programming voltages of these devices. More specifically, in the array of FIG. 1a, static charge buildup between the horizontal and vertical conductors may cause inadvertent programming of one or more of the antifuse elements 16.

According to a presently preferred embodiment of the ESD scheme of the present invention, the ESD protection device may be one or more simple fuse elements. The horizontal conductors 12-1 through 12-6 are connected to a first conductor 20 through fuse elements 22a–22f and the vertical conductors 14-1 through 14-6 are connected to a second conductor 24 through fuses 26a–26f. First and second conductors 20 and 24 are connected to an ESD protection device 28 fabricated according to the present invention. First conductor 20 is connected to a user pin 30 and second conductor 24 is connected to a user pin 32.

Figure 1B:
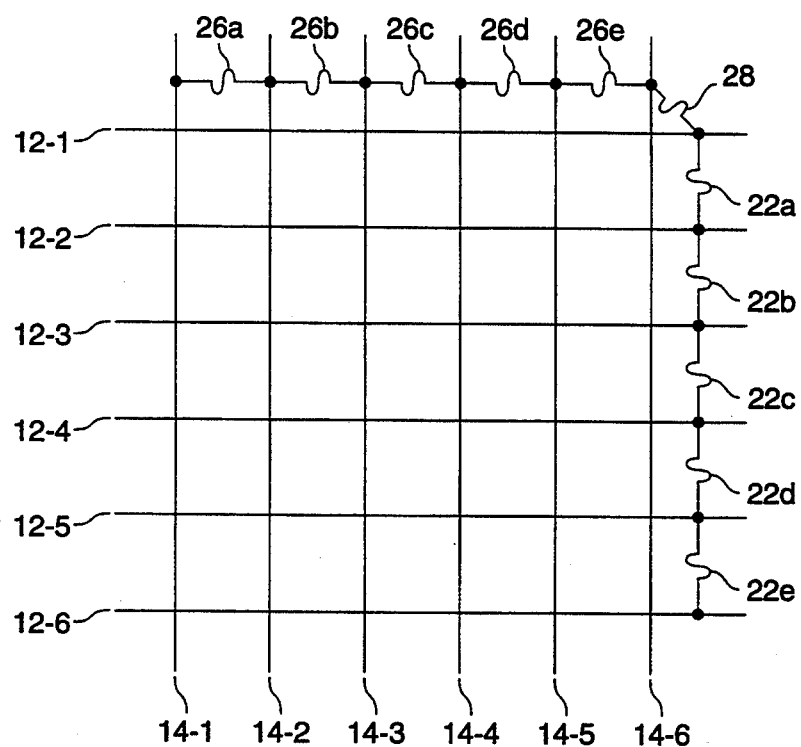

In a variation of the ESD protection scheme according to the present invention illustrated in FIG. 1b, the first and second additional conductors 20 and 24 may be eliminated. In this embodiment, fuse element 22a is connected between horizontal conductors 12-1 and 12-2. Similarly, fuse element 22b is connected between horizontal conductors 12-2 and 12-3, fuse element 22c is connected between horizontal conductors 12-3 and 12-4, fuse element 22d is connected between horizontal conductors 12-4 and 12-5, and fuse element 22e is connected between horizontal conductors 12-5 and 12-6. Fuse element 26a is connected between vertical conductors 14-1 and 14-2, fuse element 26b is connected between vertical conductors 14-2 and 14-3, fuse element 26c is connected between vertical conductors 14-3 and 14-4, fuse element 26d is connected between vertical conductors 14-4 and 14-5, and fuse element 26e is connected between vertical conductors 14-5 and 14-6.

Figure 2:
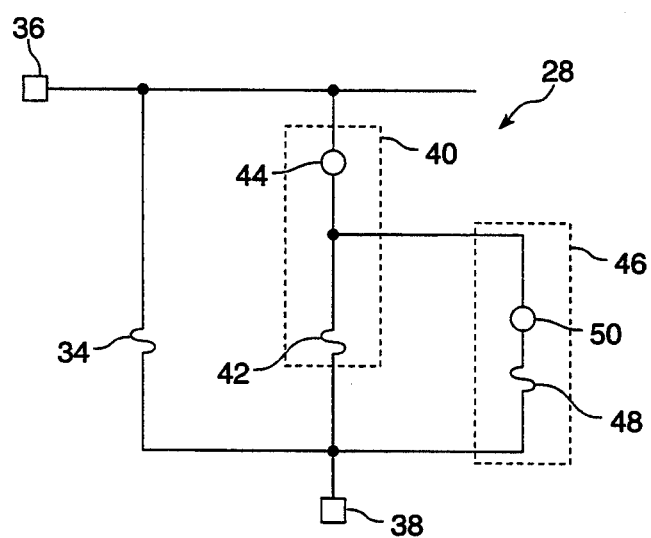
FIG. 2 is a schematic diagram of an ESD protection device according to a presently preferred embodiment of the invention.

Referring now to FIG. 2, ESD protection device 28 may include several circuit elements. A first fuse element 34 is connected between circuit nodes 36 and 38. Since first fuse element 34 is a short circuit in its unprogrammed state, it effectively shorts first and second circuit nodes 36 and 38 together. If first and second circuit nodes 36 and 38 are connected to conductors 20 and 24, respectively, it is assured that all horizontal conductors 12-1 through 12-6 and vertical conductors 14-1 through 14-6 are connected to the same voltage potential through fuse elements 22, 26, and 34. Because all of the circuit elements of the protection device and the circuit to be protected are simultaneously fabricated, the circuit containing the ESD protection device of the present invention is protected when completed.

The fuse elements for use in the ESD protection devices disclosed herein may be typical thin-film fuse-link elements as are well known in the semiconductor industry. A non-exhaustive list of materials from which these devices may be fabricated includes TiW, PtSi, polysilicon, Mo, Cr, Ni, Ti, Cu, Al, and combinations of these materials.

Typical programing currents for fuse element devices range from about 15 mA to 4 A. Those of ordinary skill in the art will appreciate that the fuse element designed for use in the present invention should be able to withstand the typical ESD pulse. The size of the fuse and its programing current are selected to withstand the size of the ESD pulses to which the ESD protection device will be subjected in operation. It has been verified that fuse elements with programming currents as small as 0.25 A can tolerate typical ESD pulses (i.e., 1 A or greater) because the short duration of such pulses results in insufficient power to produce enough heating of the fuse element material to program a fuse having such a programming current specification.

To disable the ESD protection device, a current source is connected between circuit nodes 36 and 38, and a current of sufficient magnitude to program, i.e., disrupt, first fuse element 34 is passed through it via first and second conductors 20 and 24 and user pins 30 and 32.

All fuse elements 22a–22f and 26a–26f of FIG. 1a are also programmed by passing the programming current through them from the appropriate horizontal and vertical conductors 12-1 through 12-6 and 14-1 through 14-6 through user pins 30 and 32 and other user pins or other driving circuitry (not shown) to which horizontal and vertical conductors 12-1 through 12-6 and 14-1 through 14-6 have access. The programming of fuse elements 22a–22e and 26a–26e of FIG. 1b is accomplished in a similar manner as will be appreciated by those of ordinary skill in the art.

It is often necessary to handle a device several times prior to its delivery to a customer and final use by the customer. For example, after fabrication of circuits and protection devices according to the present invention, a test procedure would normally be employed to identify defective circuits. After packaging, a final test is customarily performed to further weed out defective circuits. Finally, after delivery to the end user, the circuit would be programmed. The ESD protection device according to the present invention allows performing these tests and procedures while continuing to provide ESD protection for the circuit with which it is fabricated.

Referring again to FIG. 2, the ESD protection device according to the present invention may be more complex than a single fuse element and may also include a first dual element 40, including a second fuse element 42 in series with a first antifuse element 44. First dual element 40 is connected in parallel with first fuse element 34. A second dual element 46, including a third fuse element 48 in series with a second antifuse element 50 may also be provided and may be connected in parallel with second fuse element 42 in first dual element 40.

The presence of first and second dual elements 40 and 46 in ESD protection device 28 effectively allow reactivating and deactivating ESD protection device 28 after the programming of first fuse element 34 in order to allow for additional protection between performance of subsequent testing and other procedures. Typical fuse elements 34, 42, and 48 of ESD protection device 28 may be fabricated from 3,000 Å of Mo and employ a fuse width of 4 microns, may have a resistance of 1.3Ω and a programming current of 430 mA. Typical antifuse elements 44 and 50 may employ an antifuse layer comprising a 6,000 Å thick amorphous silicon layer and may have a programming voltage of about 60 volts. Those of ordinary skill in the art will recognize, however, that different design parameters may be employed for these elements.

Figure 3A:
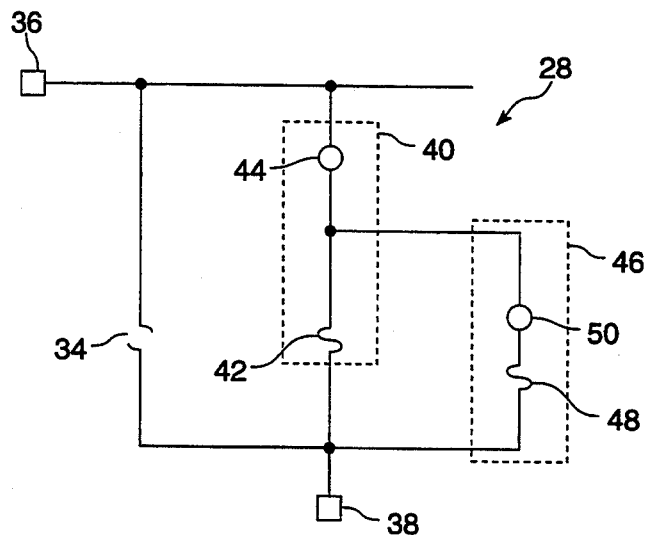
FIGS. 3a–3e are schematic diagrams of the ESD protection device of FIG. 2, shown after progressive deactivation and reactivation steps, respectively.
Figure 3B:
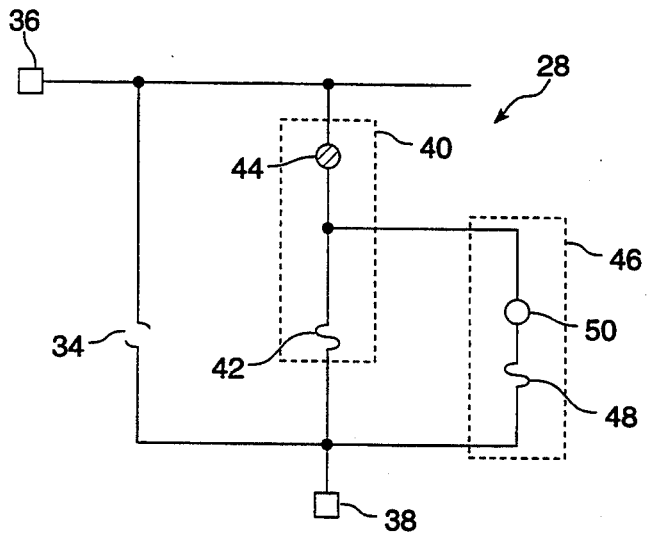
Figure 3C:
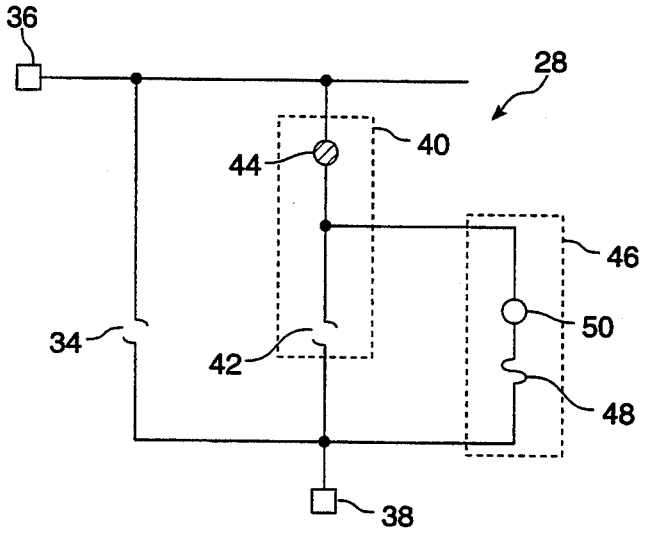
Figure 3D:
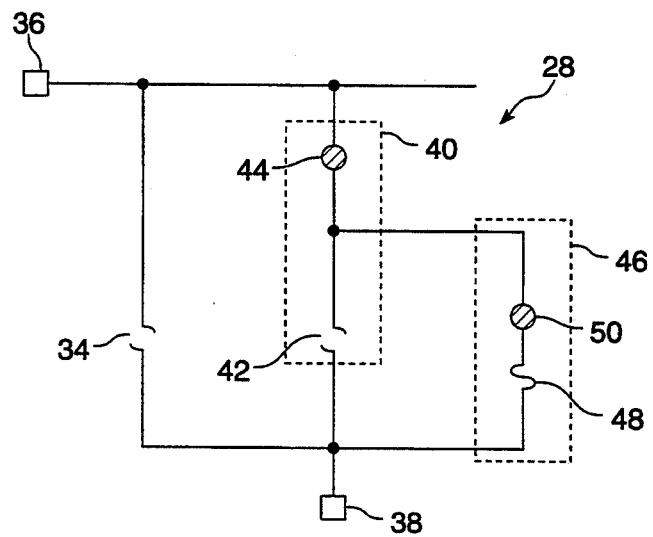
Figure 3E:
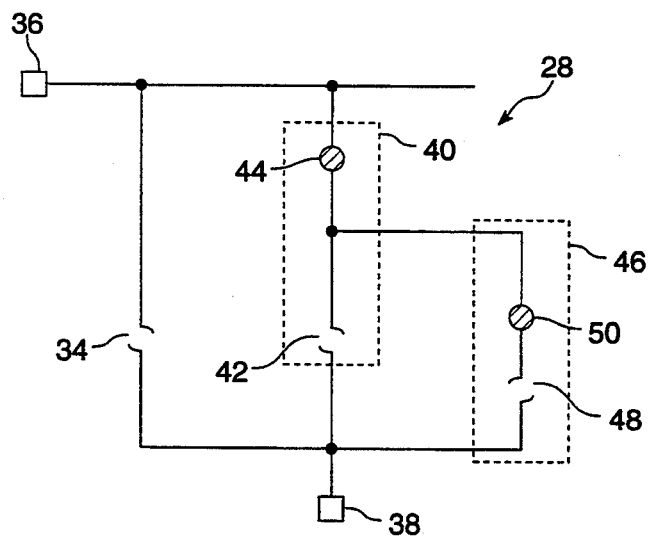

The following description of an illustrative example of the use of ESD protection device 28 of FIG. 2 is illustrated with reference to FIGS. 3a–3e. Referring first to FIG. 3a, first fuse element 34 may be programmed at wafer sort or initial test by passing a programming current between circuit nodes 36 and 38. After wafer sort or initial test, and as shown in FIG. 3b, first antifuse element 44 in first dual element 40 may be programmed to reactivate ESD protection device 28 by placing a programming voltage potential across circuit nodes 36 and 38. At final test, and as shown in FIG. 3c, ESD protection device 28 may again be deactivated by programming second fuse element 42 in first dual element 40 through circuit nodes 36 and 38. After final test, as shown in FIG. 3d, second antifuse element 50 in second dual element 46 may be programmed to reactivate ESD protection device 28 by placing a programming voltage potential across circuit nodes 36 and 38. Finally, and as shown in FIG. 3e, when the user desires to program the circuit, ESD protection device 28 may be finally deactivated by programming third fuse element 48 in second dual element 46 through circuit nodes 36 and 38.

Those of ordinary skill in the art will observe that additional deactivation-reactivation cycles may be provided in ESD protection element 28 by inserting additional dual elements in the same manner as is shown for first and second dual elements 40 and 46.

Certain design considerations must be observed for fabricating the anti fuse elements 44 and 50 in ESD protection device 28 as it is used in the environment of FIG. 1a. Care must be taken in selecting programming voltage for these devices to provide a margin to assure that the antifuse devices 16 in the interconnect array will not be programmed. One way to accomplish this is to design antifuses 44 and 50 so that they program at voltages less than the programming voltages specified for antifuse devices 16 by a margin calculated to assure that antifuse element 16 will not program unintentionally. This approach, however, requires that antifuses 44 and 50 be fabricated separately from antifuses 16 in order to achieve lower programming voltages and thus results in a longer and more costly fabrication process.

Figure 1C:
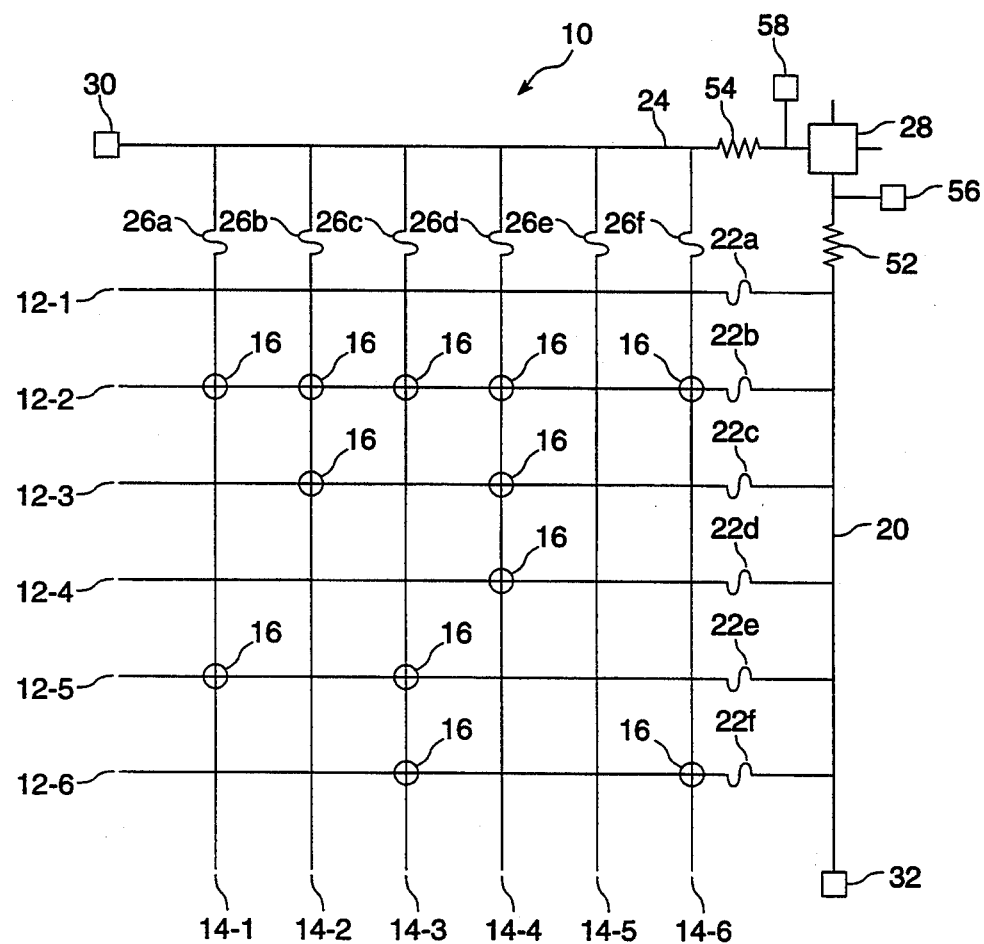
FIG. 1c is a simplified schematic diagram of an exemplary interconnect matrix including a second ESD protection scheme according to the present invention.

An embodiment of the present invention which avoids the necessity to provide antifuse structures for ESD protection having characteristics different from the antifuse structures provided in the circuit to be protected is illustrated in FIG. 1c. Like the embodiment of FIG. 1a, the embodiment of FIG. 1c may be employed in a user-programmable interconnect matrix 10 including a plurality of intersecting horizontal conductors 12-1 through 12-6 intersecting vertical connectors 14-1 through 14-6. User-programmable interconnect elements 16 are connected between selected ones of the horizontal and vertical conductors at selected ones of the intersections.

Horizontal conductors 12-1 through 12-6 are connected to a first conductor 20 through fuse elements 22a-22f and the vertical conductors 14-1 through 14-6 are connected to a second conductor 24 through fuses 26a-26f. First conductor 20 is connected to a user pin 32 and second conductor 24 is connected to a user pin 30.

As in the embodiment illustrated in FIG. 1a, first and second conductors 20 and 24 are connected to an ESD protection device 28 fabricated according to the present invention, which may comprise the ESD protection device illustrated in FIG. 2. However, unlike the embodiment depicted in FIG. 1a, a resistor 52 is placed in series between first conductor 20 and ESD protection device 28 and a resistor 54 is placed in series between second conductor 24 and ESD protection device 28. Additional user pin 56 is connected to the side of resistor 52 away from first conductor 20 and additional user pin 58 is connected to the side of resistor 54 away from second conductor 24. Resistors 52 and 54 may be fabricated from the same material as the fuse elements and have resistances chosen to minimize current flow between user pins 56 and 32 and 58 and 30 while limiting the voltage produced thereacross by ESD pulses. Typical values for these resistors range between about 15–30 $\Omega$ and act to provide a means to maintain a low voltage across the array antifuses 16 while the ESD protection devices are programmed.

The ESD protection device of FIG. 1c may be fabricated using antifuses with the same physical and electrical characteristic as the antifuses situated at the intersections of the horizontal and vertical connectors. In this embodiment, user pins 30 and 32 may be held at a common voltage (i.e., ground) during the ESD programming procedures, thus protecting the antifuses 16 in the array from inadvertent programming while user pins 56 and 58 are used to disconnect and reconnect the ESD protection device by programming its various elements as previously described.

Figure 4:
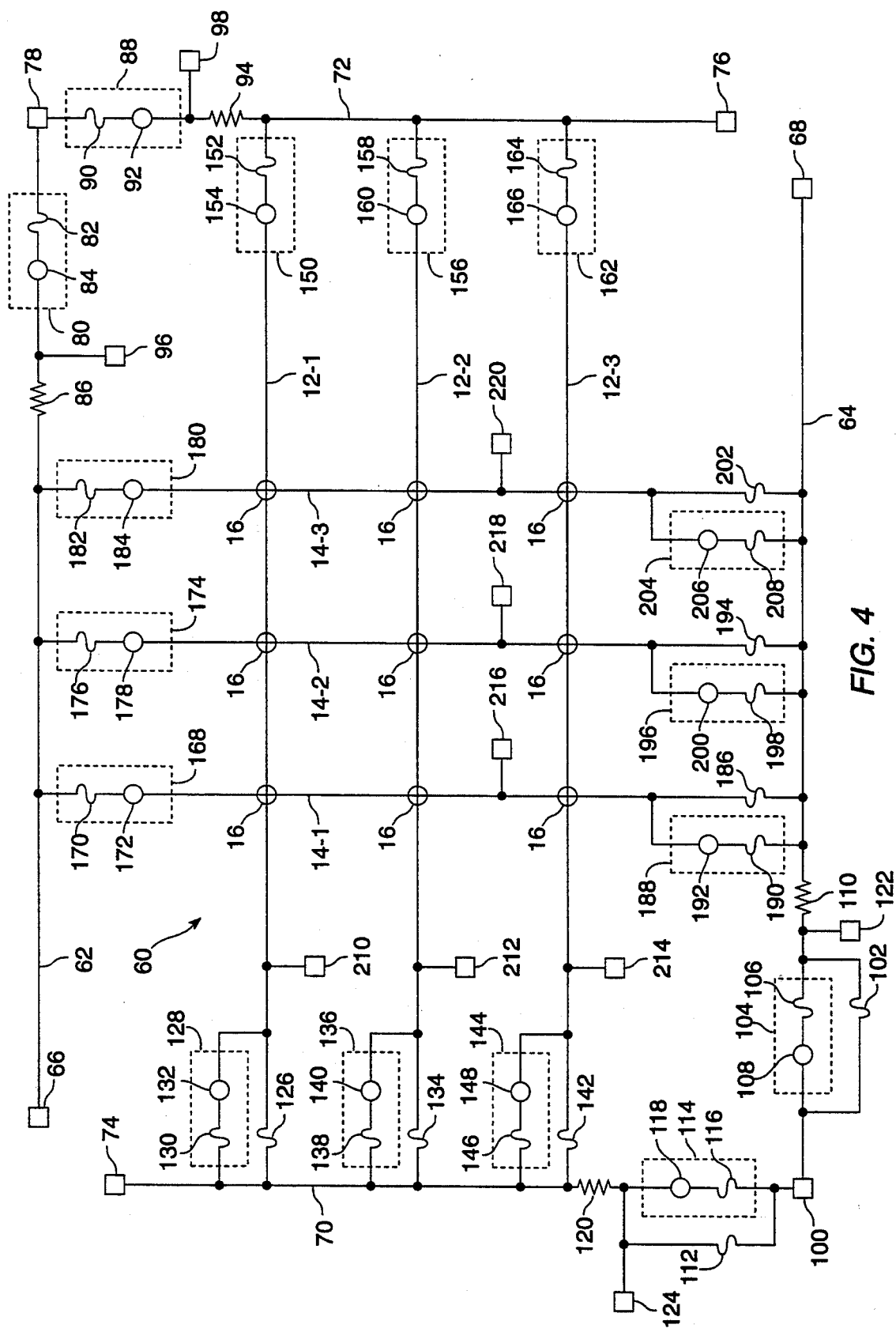
FIG. 4 is a simplified schematic diagram of an exemplary interconnect matrix including a second ESD protection scheme according to the present invention.

Another embodiment of the present invention which provides multiple levels of ESD protection and which, like the embodiment of FIG. 1a, avoids the necessity to provide antifuse structures for ESD protection having characteristics different from the antifuse structures provided in the circuit to be protected is illustrated in FIG. 4. Like the ESD protection scheme illustrated in FIGS. 1a and 1c, the ESD protection scheme illustrated in FIG. 4 is shown in a user-programmable interconnect matrix environment, although those of ordinary skill in the art will readily be able to apply the principles disclosed herein to other contexts.

Thus, an illustrative user-programmable interconnect matrix 60 is shown having horizontal conductors 12-1 through 12-3 intersecting vertical conductors 14-1 through 14-3. Antifuse elements 16 are disposed at the intersection between horizontal conductors 12-1 through 12-3 and vertical conductors 14-1 through 14-3.

The ESD protection scheme according to the present invention for protecting antifuses 16 from ESD damage includes providing additional horizontal conductors 62 and 64, connected to user pins 66 and 68, respectively, and additional vertical conductors 70 and 72 connected to user pins 74 and 76. Additional horizontal conductor 62 is also connected to user pin 78 through dual element 80, which includes fuse element 82 and antifuse element 84, and series resistor 86. Additional vertical conductor 72 is connected to user pin 78 through dual element 88, which includes fuse element 90 and antifuse element 92, and series resistor 94. User pin 96 is connected to the circuit node between dual element 80 and resistor 86. User pin 98 is connected to the circuit node between dual element 88 and resistor 94.

Additional horizontal conductor 64 is connected to user pin 100 through a network including fuse element 102 in parallel with dual element 104, which includes fuse element 106 in series with antifuse element 108, and series resistor 110. Similarly, additional vertical conductor 70 is connected to user pin 100 through a network including fuse element 112 in parallel with dual element 114, which includes fuse element 116 in series with antifuse element 118, and series resistor 120. User pin 122 is connected to the circuit node between dual element 104 and resistor 110. User pin 124 is connected to the circuit node between dual element 114 and resistor 120.

Horizontal conductor 12-1 is connected to additional vertical conductor 70 through a network including fuse element 126 in parallel with dual element 128, which includes fuse element 130 in series with antifuse element 132. Horizontal conductor 12-2 is connected to additional vertical conductor 70 through a network including fuse element 134 in parallel with dual element 136, which includes fuse element 138 in series with antifuse element 140. Horizontal conductor 12-3 is connected to additional vertical conductor 70 through a network including fuse element 142 in parallel with dual element 144, which includes fuse element 146 in series with antifuse element 148.

Horizontal conductor 12-1 is connected to additional vertical conductor 72 through dual element 150 which includes fuse element 152 in series with antifuse element 154. Horizontal conductor 12-2 is connected to additional vertical conductor 72 through a network including dual element 156, which includes fuse element 158 in series with antifuse element 160. Horizontal conductor 12-3 is connected to additional vertical conductor 72 through dual element 162, which includes fuse element 164 in series with antifuse element 166.

Vertical conductor 14-1 is connected to additional horizontal conductor 62 through dual element 168, which includes fuse element 170 in series with antifuse element 172. Vertical conductor 14-2 is connected to additional horizontal conductor 62 through dual element 174, which includes fuse element 176 in series with antifuse element 178. Vertical conductor 14-3 is connected to additional horizontal conductor 62 through dual element 180, which includes fuse element 182 in series with antifuse element 184.

Vertical conductor 14-1 is connected to additional horizontal conductor 64 through a network including fuse element 186 in parallel with dual element 188, which includes fuse element 190 in series with antifuse element 192. Vertical conductor 14-2 is connected to additional horizontal conductor 64 through a network including fuse element 194 in parallel with dual element 196, which includes including fuse element 198 in series with antifuse element 200. Vertical conductor 14-3 is connected to additional horizontal conductor 64 through a network including fuse element 202 in parallel with dual element 204, which includes fuse element 208 in series with antifuse element 206.

As in the embodiment of FIG. 1c, the resistors 86, 94, 110, and 120 of the embodiment of FIG. 4 may be formed from the same material as the fuse elements. Resistors 86, 94, 110, and 120 are designed to withstand both the pulse widths and currents associated with ESD and the programming voltages and currents used for the programmable devices.

After manufacture of the structure has been completed, and prior to any programming, ESD protection of antifuses in matrix 60 is provided because horizontal conductors 12-1 through 12-3 are connected to user pin 100 through fuse elements 126, 134, and 142, resistor 120, and fuse element 112. Vertical conductors 14-1 through 14-3 are connected to user pin 100 through fuse elements 186, 194 and 202, resistor 110, and fuse element 102. Because resistors 110 and 120 have a resistance of about 15 Ω, a low resistance path exists between the horizontal and vertical conductors of matrix 60.

The ESD protection scheme illustrated in FIG. 4 is capable of multiple deactivation-reactivation cycles. FIGS. 5a–5e illustrate the conditions of the fuse elements and antifuse elements in each state of the cycles. The symbols used to illustrate the unprogrammed and programmed states of the fuse elements and antifuse elements In FIGS. 5a–5e are the same symbols illustrated in FIGS. 3a–3e.

Figure 5A:
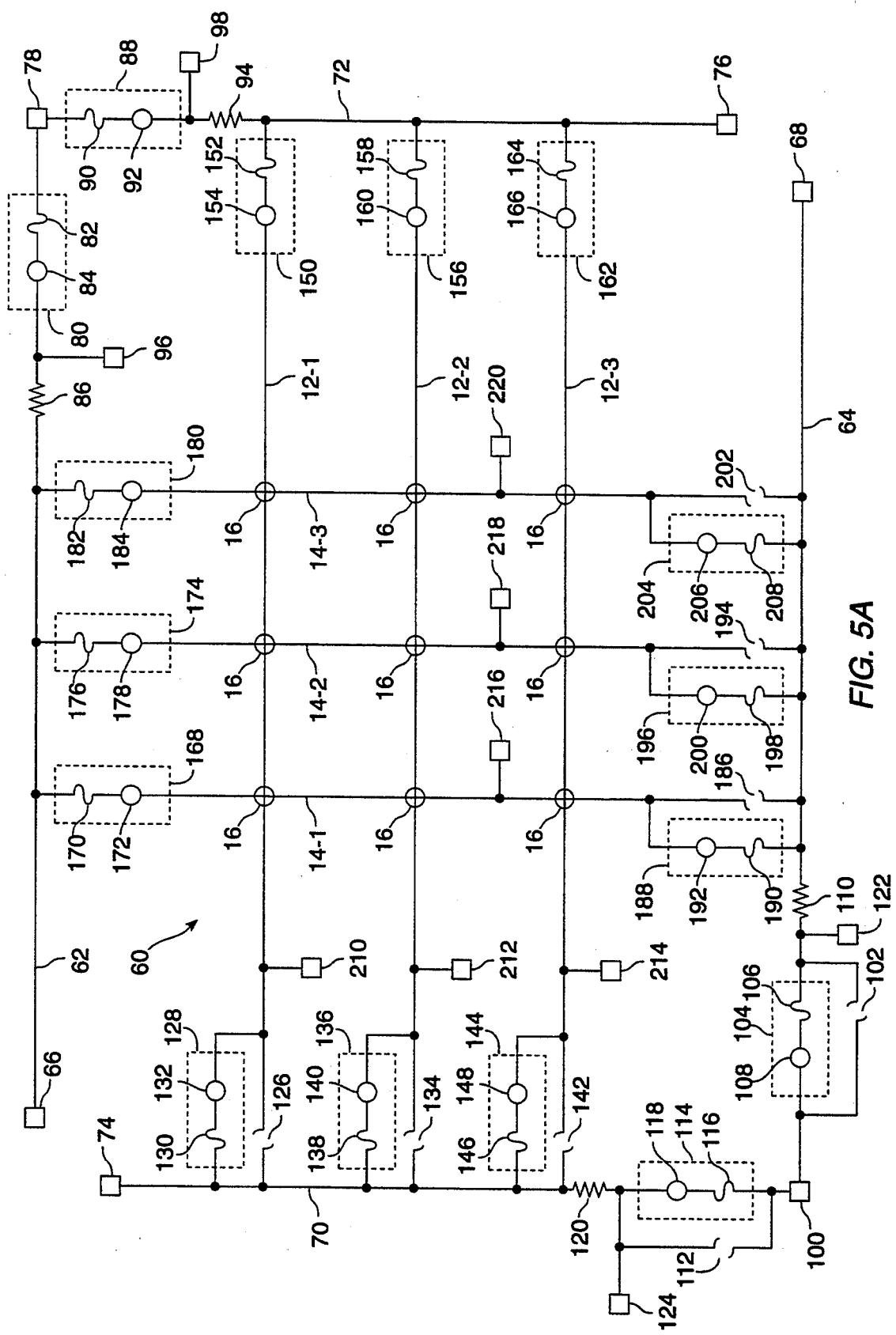
FIGS. 5a–5e are schematic diagrams of the ESD protection scheme of FIG. 4, showing the various activation and deactivation cycles.

FIG. 5a illustrates how the ESD protection for array 60 is temporarily deactivated, for example to perform a wafer sort test. Fuse element 102 is programmed by passing a programming current from user pin 122 to user pin 100. Similarly, fuse element 112 is programmed by passing a programming current from user pin 124 to user pin 100, while user pins 68 and 74 are held at a fixed potential, such as ground, to prevent inadvertent programming of antifuses 16 in the array. Fuse elements 126, 134, and 142 are programmed by passing a programming current from user pin 74 to user pins 210, 212, and 214, communicating with horizontal conductors 12-1, 12-2, and 12-3, respectively. Fuse elements 186, 194, and 202 are programmed by passing a programming current from user pin 68 to user pins 216, 218, and 220, communicating with vertical conductors 14-1, 14-2, and 14-3, respectively.

Those of ordinary skill in the art will recognize that, while FIG. 4 illustrates an embodiment of a user-programmable interconnect matrix where user pins 210, 212, 214, 216, 218, and 220 are connected directly to the horizontal and vertical conductors in the matrix, other embodiments without such direct connections of user pins are possible. In such situations, indirect programming path may be identified and utilized. FIG. 5a shows the states of the fuse elements and antifuse elements after the above-described programming steps have been completed.

Figure 5B:
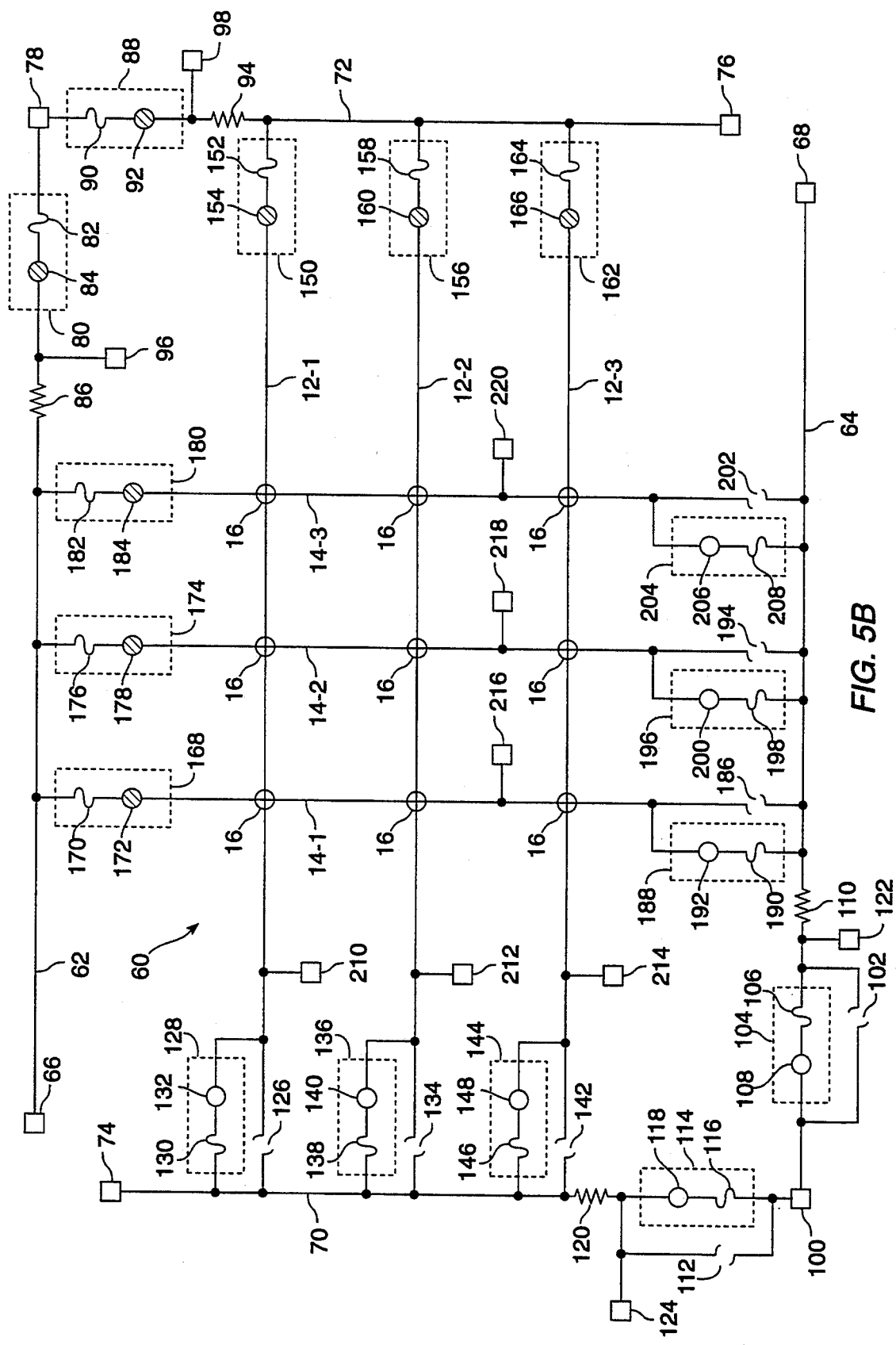

After performing the wafer sort test, the ESD protection may be reactivated by programming antifuse elements 154, 160, and 166 by placing the programming voltage potential across user pin 76 and user pins 210, 212, and 214. Antifuse elements 172, 178, and 184 are programmed by placing the programming voltage potential across user pin 66 and user pins 216, 218, and 220. Antifuse elements 84, 92 are programmed by placing a programming voltage potential between user pins 96 and 78 and 98 and 78 while user pins 66 and 78 are held at a fixed potential, such as ground, to prevent programming any antifuses 16 in the array. After these devices have been programmed a low impedance path exists from user pin 78 to the horizontal and vertical conductors and all pins of the device through resistors 86 and 94, preferably having the same resistance values as resistors 110 and 120. FIG. 5b shows the states of the fuse elements and antifuse elements after the above-described programming steps have been completed.

Figure 5C:
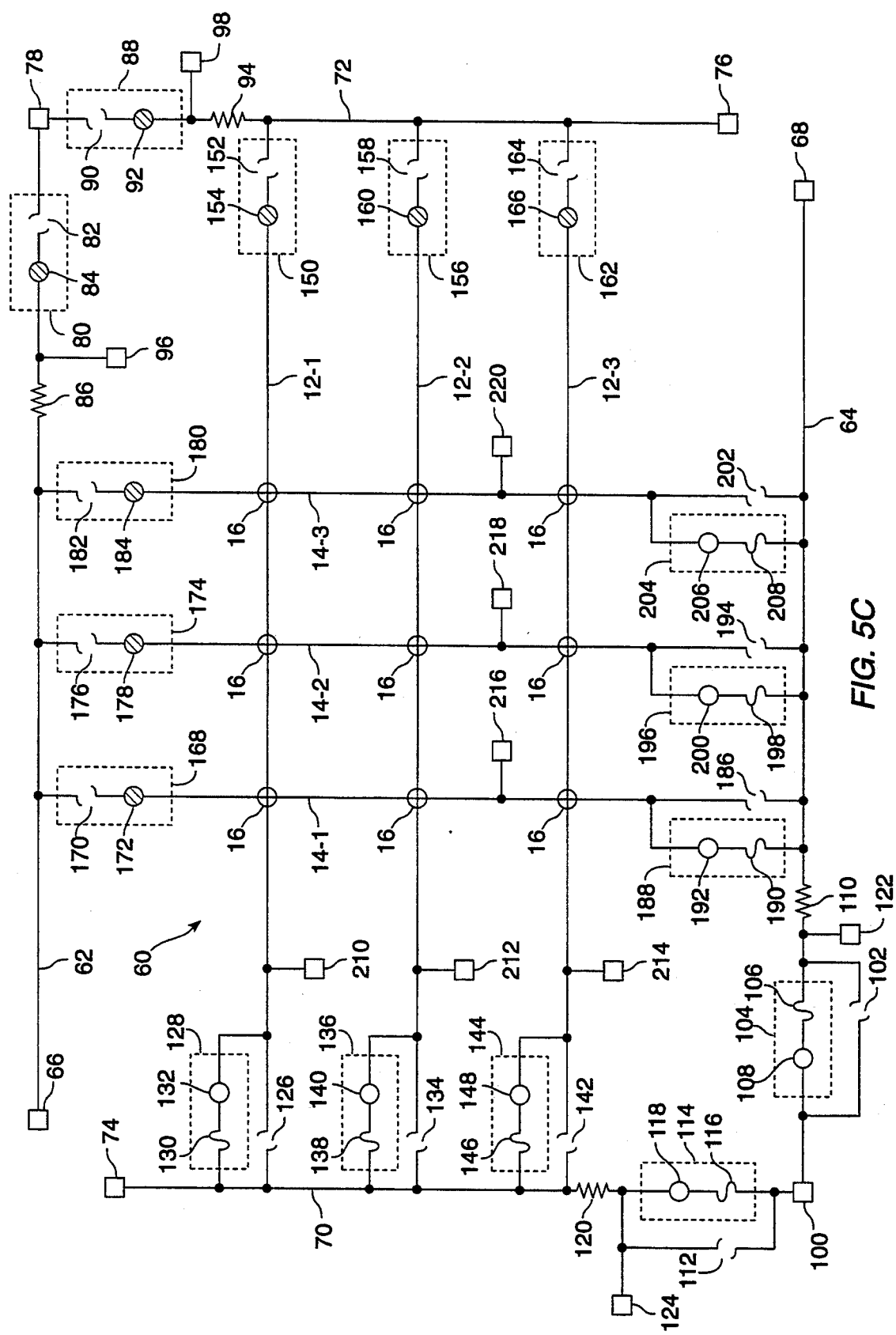

To allow further testing of the user-programmable interconnect matrix product (i.e., after final assembly), fuse elements 82 and 90 are programmed by passing the programming current between user pins 96 and 78 and 98 and 78, while holding user pins 66 and 76 at the fixed potential. Fuse elements 152, 158 and 164 are programmed by passing the programming current between user pin 76 and user pins 210, 212, and 214. Fuse elements 170, 176 and 182 are programmed by passing the programming current between user pin 66 and user pins 216, 218, and 220. FIG. 5c shows the states of the fuse elements and antifuse elements after the above-described programming steps have been completed.

Figure 5D:
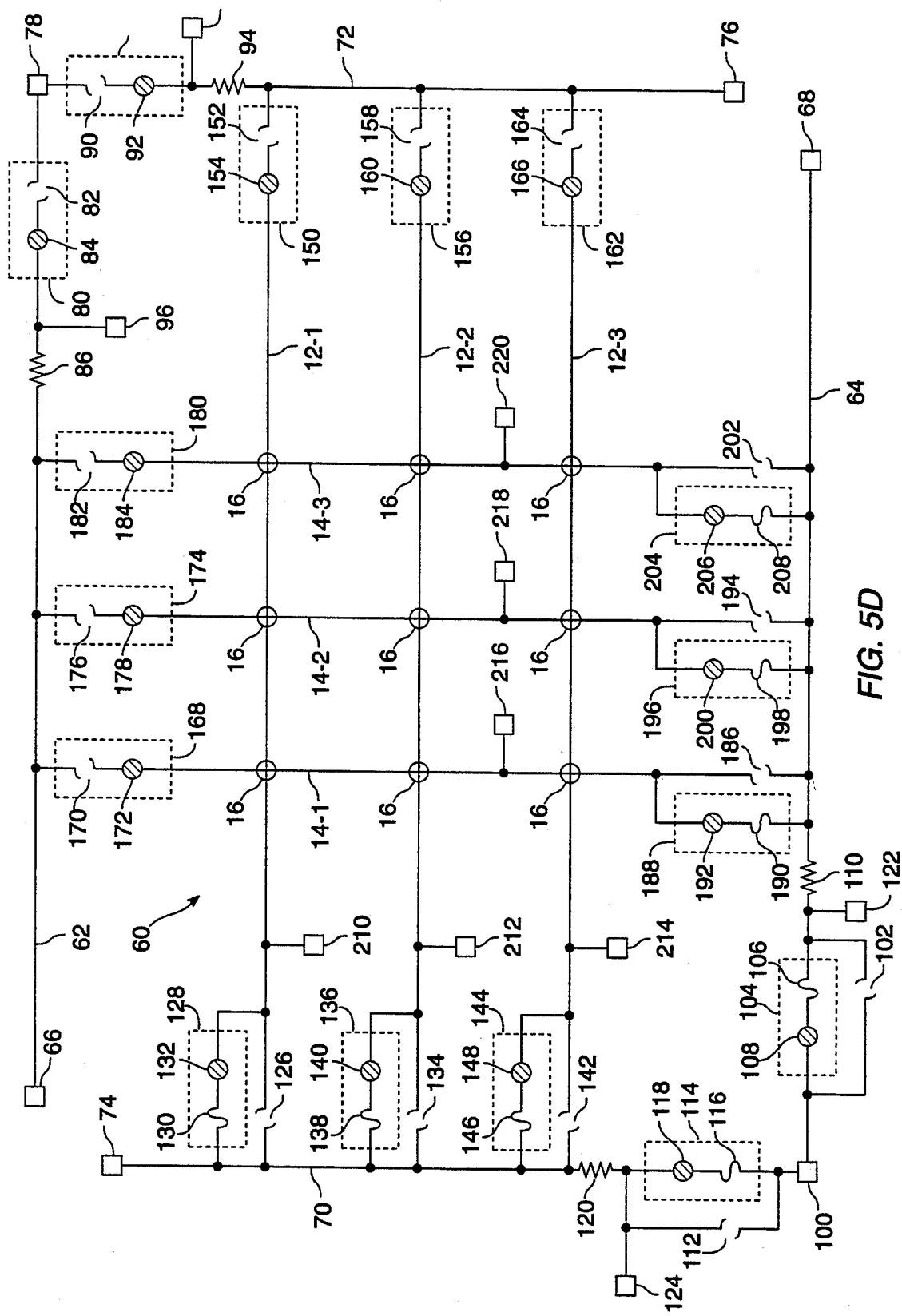

ESD protection of the product may then be reactivated for shipping by programming antifuse elements 108, 118, 132, 140, 148, 192, 200, and 206 by appropriately applying the programming potential to them via user pins 68, 74, 122, 124, 210, 212, 214, 216, 218, and 220 in the same manner as previously described. The programming procedures are similar to those already described and, from an examination of FIG. 4, those of ordinary skill in the art will recognize which user pins to employ for this programming step. FIG. 5d shows the states of the fuse elements and antifuse elements after the above-described programming steps have been completed.

Figure 5E:
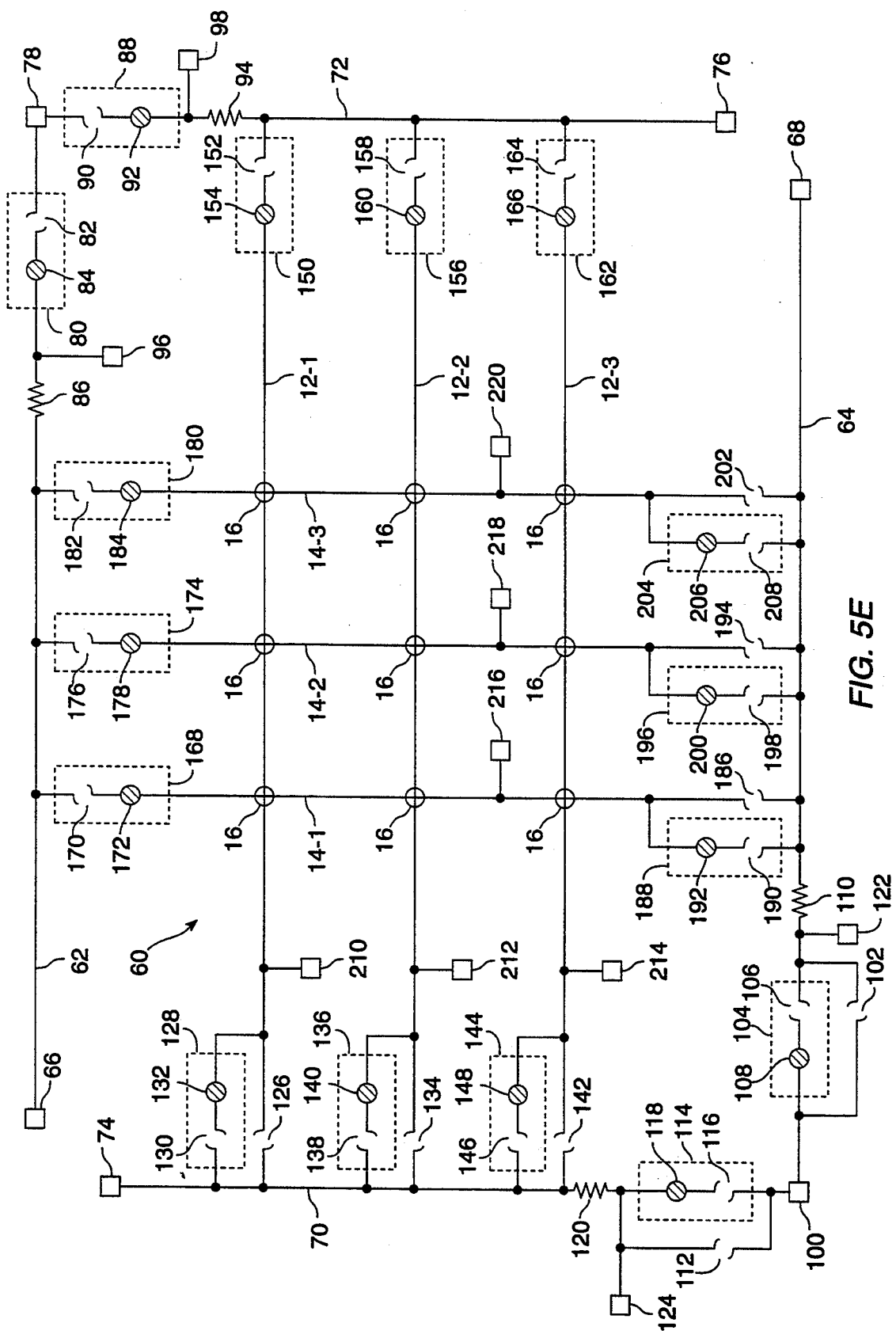

Finally, the user may program and use the product after deactivating the ESD protection by programming the remaining fuse elements 106, 116, 130, 138, 146, 190, 198, and 208 by passing the programming current between the appropriate user pins. FIG. 5e shows the states of the fuse elements and antifuse elements after the above-described programming steps have been completed.

Like the embodiment of FIG. 1c, the embodiment of FIG. 4 may employ antifuse elements having the same structure and programming characteristics as antifuses 16 in the matrix. As a result, the embodiment of FIG. 4 may be more economically manufactured than the embodiment of FIG. 1a.

Figure 6:
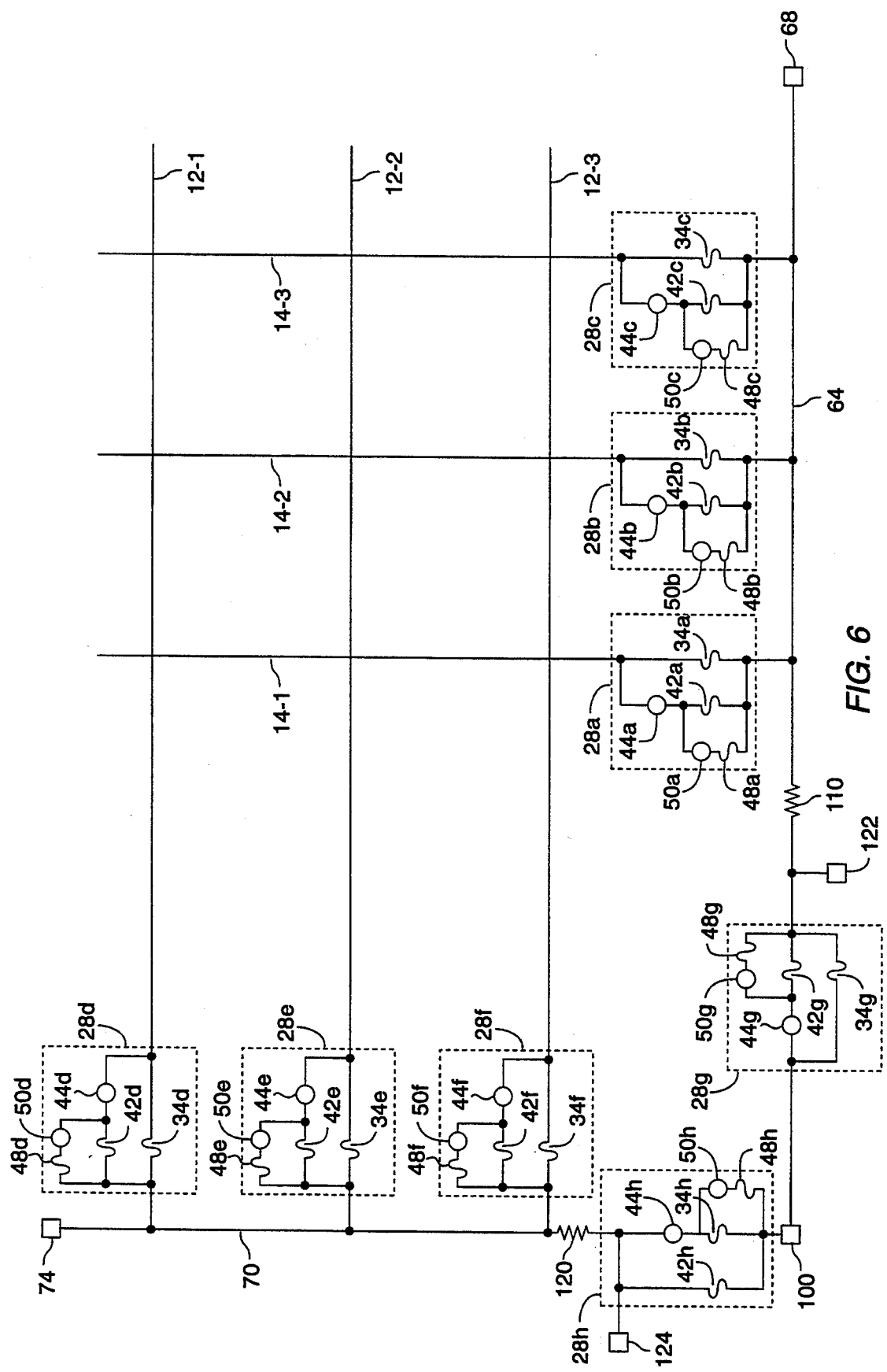
FIG. 6 is a simplified schematic diagram of an ESD protection scheme according to the present invention which is a simplified version of the scheme depicted in FIG. 4.

The ESD protection scheme of FIG. 4 allows for the integrity testing of the horizontal and vertical conductors in the matrix because the ESD protection devices are connected and disconnected from both sides and the top and bottom of the array. If such integrity testing is not necessary, the ESD protection scheme of FIG. 4 can be provided with only one horizontal conductor and one vertical conductor instead of the two horizontal conductors 62 and 64 and the two vertical conductors 70 and 72. FIG. 6 illustrates such a scheme, in which employs additional horizontal conductor 64 and additional vertical conductor 70 connected to user pins 68 and 74, respectively. Additional horizontal conductor 64 is connected to vertical conductors 14-1, 14-2, and 14-3 through ESD protection device 28a, 28b, and 28c, respectively. Additional vertical conductor 70 is connected to horizontal conductors 12-1, 12-2, and 12-3 through ESD protection device 28d, 28e, and 28f, respectively. Additional horizontal conductor 64 is connected to user pin 100 through resistor 110 and ESD protection device 28g. Additional vertical conductor 70 is connected to user pin 100 through resistor 120 and ESD protection device 28h.

The ESD protection scheme illustrated in FIG. 6 may be deactivated and reactivated twice. The first deactivation is accomplished by programming fuse elements 34a-34h in ESD protection devices 28a-28h. The first reactivation is accomplished by programming antifuses 44a-44h in ESD protection devices 28a-28h. The second deactivation is accomplished by programming fuse elements 42a-42h in ESD protection devices 28a-28h. The second reactivation is accomplished by programming antifuses 50a-50h in ESD protection devices 28a-28h. The final deactivation is accomplished by programming fuse elements 48a-48h in ESD protection devices 28a-28h. As with the embodiments of FIG. 1c and FIG. 4, those of ordinary skill in the art will recognize that user pins 122 and 124 are used for programming the elements in ESD protection devices 28g and 28h to protect antifuse elements 16 in the array.

While the present invention and its various embodiments have been disclosed in the context of user-programmable interconnect arrays, those of ordinary skill in the art will readily recognize that the invention is widely applicable to structures which may be damaged by ESD. The ESD protection device of the present invention is useful for protecting both electronic components and microcircuits (i.e., a collection of electronic devices or conductors and insulating layers disposed on any type and size of substrate) and other components which are subject to different types of ESD damage. The ESD protection device of the present invention is usually integrated on the same substrate as the component to be protected. There is no limit to the size of the component to be protected. For example, the component or components to be protected may range from a single transistor, integrated circuit, hybrid circuit, multichip module substrate, multichip module, or the like, to a larger structure such as a printed circuit board or flat panel display, etc.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A deactivatable, reactivatable, ESD protection device for preventing damage to at least one electrical component connected directly or indirectly between a first circuit node and a second circuit node, comprising:
   a first fuse element connected between said first circuit node and said second circuit node;
   a first dual element connected in parallel with said first fuse element, said first dual element comprising a second fuse element in series with a first antifuse element.

2. The ESD protection device of claim 1, further including a second dual element connected in parallel with said second fuse element, said second dual element comprising a third fuse element in series with a second antifuse element.

3. An electrically deactivatable ESD protection circuit for at least one component, comprising:
   at least one first conductor;
   at least one second conductor forming at least one intersection with said at least one first conductors;
   at least one component connected between said at least one said first and said at least one second conductors at said at least one intersection, said at least one component susceptible to ESD damage;
   a first additional conductor connected to a first external node;
   a second additional conductor connected to a second external node;
   a first ESD protection element connected between said first additional conductor and said at least one said first conductor;
   a second ESD protection element connected between said second additional conductor and said at least one second conductor;
   a third external node;
   a third ESD protection element connected between said first additional conductor and said third external node; and
   a fourth ESD protection element connected between said second additional conductor and said third external node.

4. The ESD protection circuit of claim 3 wherein said first, second, third, and fourth ESD protection elements include a fuse element.

5. The ESD protection circuit of claim 3 wherein said first, second, third, and fourth ESD protection elements include a first fuse element and a first dual element connected in parallel with said first fuse element, said first dual element comprising a second fuse element in series with a first antifuse element.

6. The ESD protection circuit of claim 3 wherein said first, second, third, and fourth ESD protection elements include a first fuse element, a first dual element connected in parallel with said first fuse element, said first dual element comprising a second fuse element in series with a first antifuse element, and a second dual element connected in parallel with said second fuse element, said second dual element comprising a third fuse element in series with a second antifuse element.

7. The ESD protection circuit of claim 3, further including:
   a first resistor connected between said third ESD protection device and said first additional conductor;
   a second resistor connected between said fourth ESD protection device and said second additional conductor;
   a fourth external circuit node connected to a circuit node comprising the common connection of said third ESD protection device and said first resistor; and
   a fifth external circuit node connected to a circuit node comprising the common connection of said fourth ESD protection device and said second resistor.

8. The ESD protection circuit of claim 7 wherein said first, second, third, and fourth ESD protection elements include a fuse element.

9. The ESD protection circuit of claim 7 wherein said first, second, third, and fourth ESD protection elements include a first fuse element and a first dual element connected in parallel with said first fuse element, said first dual element comprising a second fuse element in series with a first antifuse element.

10. The ESD protection circuit of claim 7 wherein said first, second, third, and fourth ESD protection elements include a first fuse element, a first dual element connected in parallel with said first fuse element, said first dual element comprising a second fuse element in series with a first antifuse element, and a second dual element connected in parallel with said second fuse element, said second dual element comprising a third fuse element in series with a second antifuse element.

11. The ESD protection circuit of claim 7 wherein said at least one component is an antifuse.

12. An Electrically deactivatable ESD protection circuit for a component, comprising:
   at least one first conductor;
   at least one second conductor forming at least one intersection with said at least one first conductor;
   at least one component connected between said at least one first and said at least one second conductors at said at least one intersection, said at least one component susceptible to ESD damage;
   a first additional conductor connected to a first external node;
   a second additional conductor connected to a second external node;
   a third additional conductor connected to a third external node;
   a fourth additional conductor connected to a fourth external node;
   at least one first ESD protection element connected between said first additional conductor and a first end of said at least one first conductor;
   at least one second ESD protection element connected between said second additional conductor and a first end of said at least one second conductor;
   at least one third ESD protection element connected between said third additional conductor and a second end of said at least one first conductor;
   at least one fourth ESD protection elements connected between said fourth additional conductor and a second end of said at least one second conductor;
   a fifth external node;
   a fifth ESD protection element connected between said first additional conductor and said fifth external node;
   a sixth ESD protection element connected between said second additional conductor and said fifth external node;
   a sixth external node;
   a seventh ESD protection element connected between said third additional conductor and said sixth external node;
   a eighth ESD protection element connected between said fourth additional conductor and said sixth external node.

13. The ESD protection circuit of claim 12 wherein said first, second, fifth, and sixth ESD protection elements comprise a first fuse element and a first dual element connected in parallel with said first fuse element, said first dual element comprising a second fuse element in series with a first antifuse element, and said third, fourth, seventh, and eighth ESD protection elements comprise a dual element comprising a fuse element in series with an antifuse element.

14. The ESD protection circuit of claim 12, further including:
   a first resistor connected between said fifth ESD protection device and said first additional conductor;
   a second resistor connected between said sixth ESD protection device and said second additional conductor;
   a seventh external circuit node connected to a circuit node comprising the common connection of said fifth ESD protection device and said first resistor;
   a eighth external circuit node connected to a circuit node comprising the common connection of said sixth ESD protection device and said second resistor;
   a third resistor connected between said seventh ESD protection device and said third additional conductor;
   a fourth resistor connected between said eighth ESD protection device and said fourth additional conductor;
   a seventh external circuit node connected to a circuit node comprising the common connection of said seventh ESD protection device and said third resistor; and
   a eighth external circuit node connected to a circuit node comprising the common connection of said eighth ESD protection device and said fourth resistor.

15. The ESD protection circuit of claim 14 wherein said first, second, fifth, and sixth ESD protection elements comprise a first fuse element and a first dual element connected in parallel with said first fuse element, said first dual element comprising a second fuse element in series with a first antifuse element, and said third, fourth, seventh, and eighth ESD protection elements comprise a dual element comprising a fuse element in series with an antifuse element.

16. The ESD protection circuit of claim 12 wherein said at least one component is an antifuse.

* * * * *